United States Patent [19]

Cambou et al.

[11] Patent Number: 5,281,839

[45] Date of Patent: Jan. 25, 1994

[54] SEMICONDUCTOR DEVICE HAVING A SHORT GATE LENGTH

[75] Inventors: Bertrand F. Cambou, Mesa; Robert B. Davies, Tempe, both of Ariz.

[73] Assignee: Motorola, Inc., Schaumburg, Ill.

[21] Appl. No.: 52,856

[22] Filed: Apr. 23, 1993

Related U.S. Application Data

[63] Continuation of Ser. No. 729,662, Jul. 15, 1991, abandoned.

[51] Int. Cl.⁵ .................... H01L 29/20; H01L 29/22
[52] U.S. Cl. .................................. 257/345; 257/40; 257/496
[58] Field of Search ............ 357/22, 23.1, 23.3, 357/23.4; 437/39, 176, 912; 257/260, 289, 401, 355, 345, 496

[56] References Cited

U.S. PATENT DOCUMENTS 4,994,872  2/1991  Nishizawa et al. .............. 357/23.4

FOREIGN PATENT DOCUMENTS 0030178  6/1981  European Pat. Off. .
2466862  4/1981  France .
57-7118   7/1983  Japan .................................. 437/39
59-225571 12/1984 Japan .................................. 357/22
61-12079  1/1986  Japan ................................. 437/912
61-89674  5/1986  Japan ................................ 357/23.4
61-90467  5/1986  Japan .................................. 437/39
63-87773  4/1988  Japan .................................. 357/22
2-205325  8/1990  Japan .................................. 357/22

OTHER PUBLICATIONS

A. Hartstein et al., "A metal-oxide-semiconductor field-effect transistor with a 20-nm channel length", Journal of Applied Physics Communications, vol. 68, No. 5, 1 Sep. 1990, New York, pp. 2493-2495.

Primary Examiner—Jerome Jackson
Assistant Examiner—Donald L. Monin, Jr.
Attorney, Agent, or Firm—Miriam Jackson

[57] ABSTRACT

A semiconductor device having a channel region having a first and a second portion. The first and second portions of the channel region are designed so that only a small portion is substantially depleted during operation. Thus, a semiconductor device having a short gate length is fabricated.

16 Claims, 6 Drawing Sheets

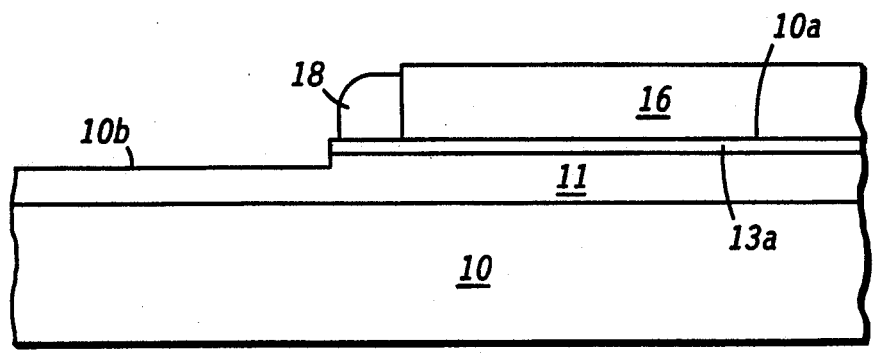
*FIG. 4*
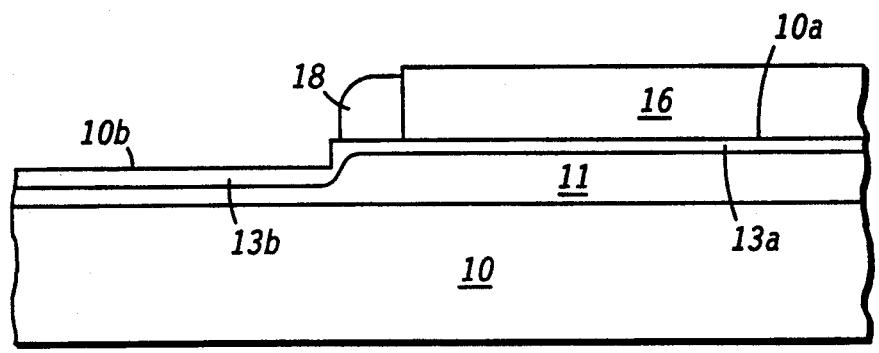
*FIG. 5*
*FIG. 6*
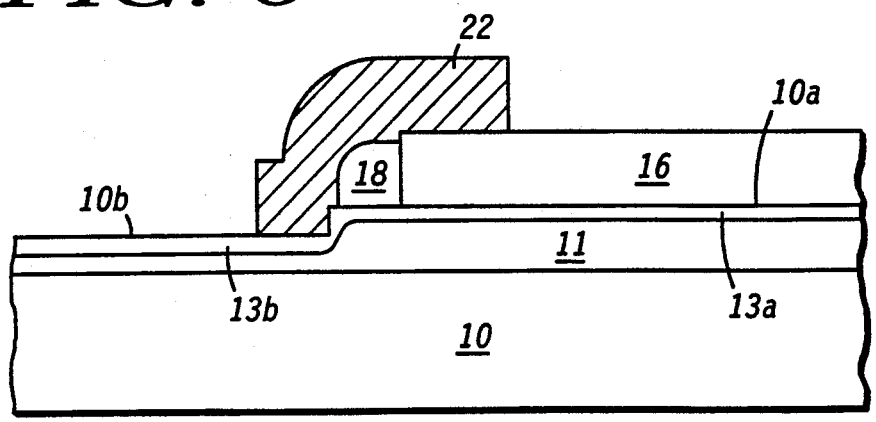

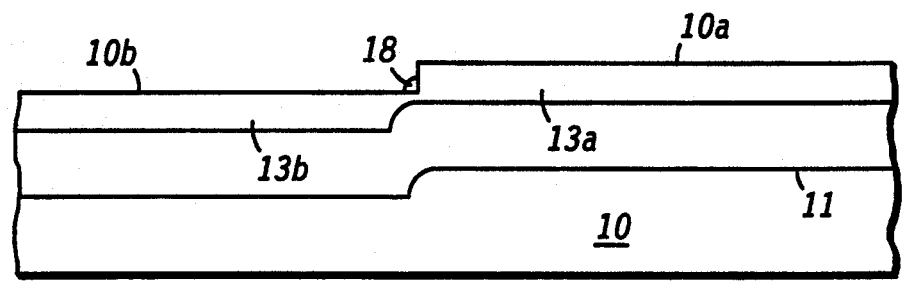
FIG. 10
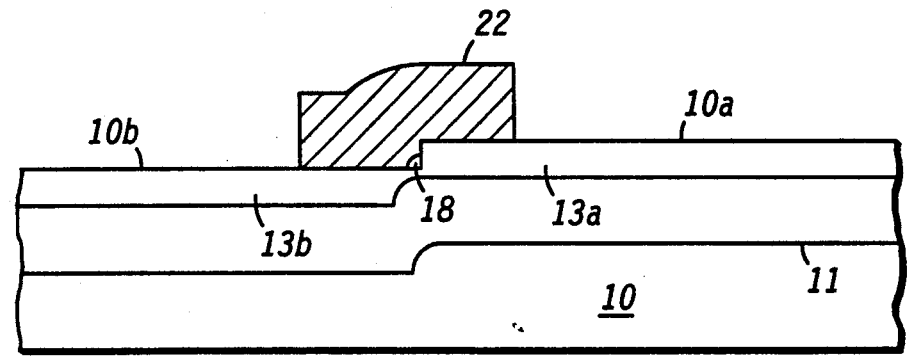
FIG. 11
FIG. 12
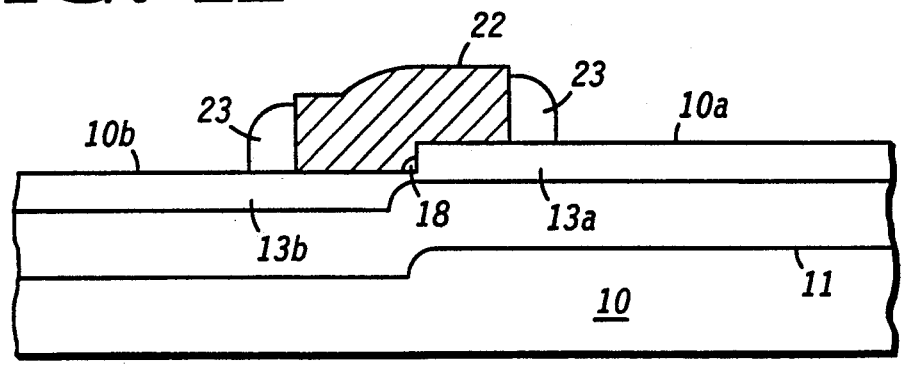

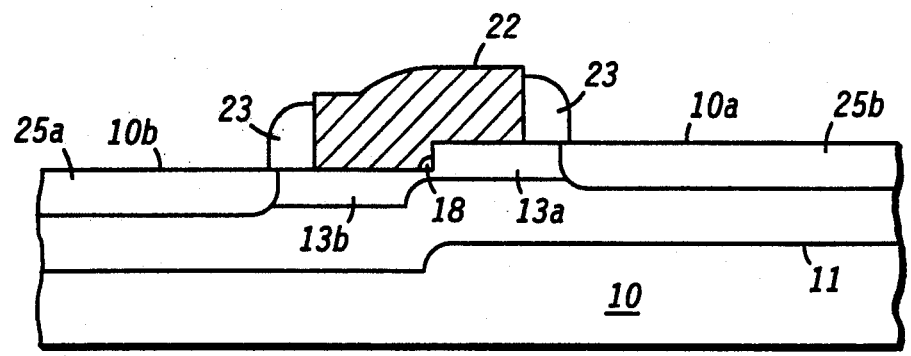
FIG. 13
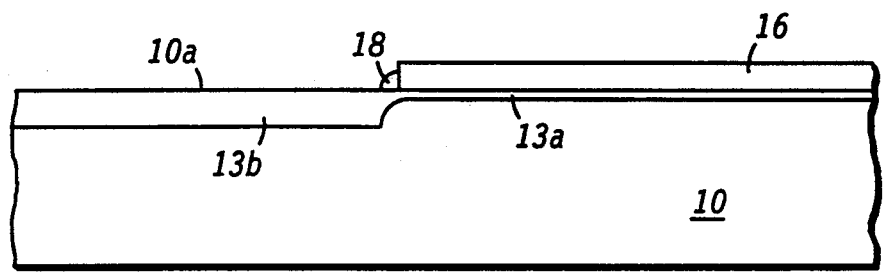
FIG. 14
FIG. 15
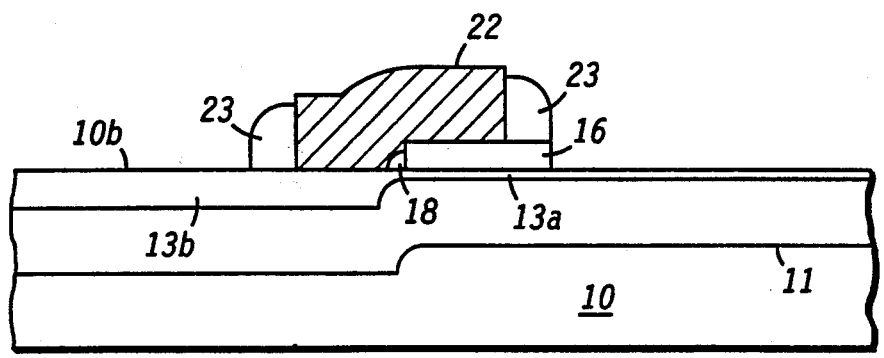

SEMICONDUCTOR DEVICE HAVING A SHORT GATE LENGTH

This application is a continuation of prior application Ser. No. 07/729,662, filed Jul. 15, 1991, now abandoned.

BACKGROUND OF THE INVENTION

This invention relates, in general, to semiconductor devices, including, but not limited to, a gallium arsenide device having a short gate length and a method of fabricating it.

An important feature of gallium arsenide devices, such as MESFETs (Metal Semiconductor Field Effect Transistors) or HEMTs (High Electron Mobility Transistors), is its gate length. The length of the gate is directly proportional to the frequency response of these gallium arsenide devices. Devices having a shorter gate length enable higher frequency responses to be achieved. Devices fabricated by standard processing typically have a 20 GHz capability. It would be desirable to fabricate a MESFET having a 100 GHz capability. However, in the past there has been a limit as to how short gate lengths can be fabricated using standard processing techniques, due to the processing constraints of present standard photolithographic means. A way of achieving shorter gate lengths is by using electron beam technology rather than standard photolithographic means. However, electron beam processing is not very manufacturable and is very expensive to use at this time. It would also be desirable to fabricate devices having a short gate length without the use of electron beam technology using a self-aligned gate process. A self-aligned gate process provides for better reproducability and reduces some parasitic capacitances in the device.

SUMMARY OF THE INVENTION

A semiconductor device, comprising a semiconductor material, having a top surface. A first portion of a channel region of a first conductivity type is formed in the semiconductor material extending from the top surface into the semiconductor material. A second portion of the channel region of the first conductivity type is formed in the semiconductor material extending from the top surface into the semiconductor material, wherein the second portion of the channel region is continuous with the first portion of the channel region and extends further into the semiconductor material from the top surface than the first portion of the channel region. A gate layer is disposed on the top surface over a portion of the first and the second portions of the channel region.

BRIEF DESCRIPTION OF THE DRAWINGS

FIG. 4 illustrates an enlarged, cross-sectional view of the second embodiment of the present invention in a further stage of fabrication;

FIG. 5 illustrates an enlarged, cross-sectional view of the second embodiment of the present invention in a further stage of fabrication;

FIG. 6 illustrates an enlarged, cross-sectional view of the second embodiment of the present invention in a further stage of fabrication;

FIG. 10 illustrates an enlarged, cross-sectional view of the third embodiment of the present invention in a further stage of fabrication;

FIG. 11 illustrates an enlarged, cross-sectional view of the third embodiment of the present invention in a further stage of fabrication;

FIG. 12 illustrates an enlarged, cross-sectional view of the third embodiment of the present invention in a further stage of fabrication;

FIG. 13 illustrates an enlarged, cross-sectional view of the third embodiment of the present invention in a further stage of fabrication;

FIG. 14 illustrates an enlarged, cross-sectional view of a fourth embodiment of the present invention in a beginning stage of fabrication;

FIG. 15 illustrates an enlarged, cross-sectional view of the fourth embodiment of the present invention in a further stage of fabrication.

DETAILED DESCRIPTION OF THE DRAWINGS

Figure 1:
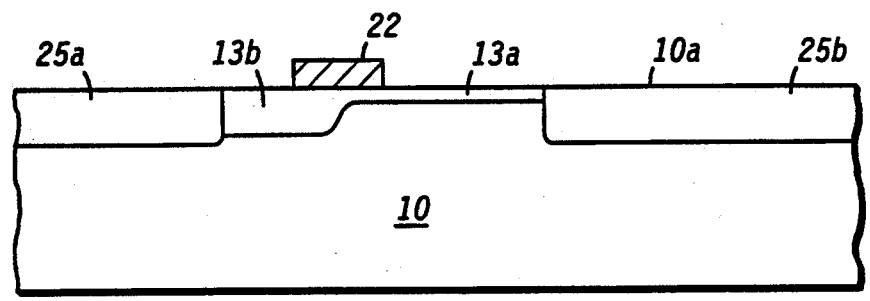
FIG. 1 illustrates an enlarged, cross-sectional view of a first embodiment of the present invention.

FIG. 1 illustrates an enlarged, cross-sectional view of a first embodiment of the present invention in an intermediate stage of fabrication. FIG. 1 illustrates a semiconductor material 10 having a first top surface 10a. In a preferred embodiment, semiconductor material 10 is comprised of a semi-insulating substrate, preferably an undoped gallium arsenide. In semiconductor material 10, a first portion of a channel region 13a is formed extending from first top surface 10a into semiconductor material 10. First portion of channel 13a is of a first conductivity type. In a preferred embodiment, first portion of channel region 13a is formed to be N-type by ion implantation of suitable dopants, such as silicon. A second portion of channel region 13b is formed extending from first top surface 10a into semiconductor material 10, wherein second portion of channel region 13b is continuous with first portion 13a, but extends further in semiconductor material 10 than does first portion 13a. Second portion of channel region 13b is also of the first conductivity type, and also formed by ion implantation. Second portion of channel region 13b is formed so that it is not substantially depleted during operation of the semiconductor device.

Subsequently, a gate layer 22 is formed on a portion of first top surface 10a extending over a portion of first portion of channel region 13a and a portion of second portion of channel region 13b. Gate layer 22 is comprised of a refractory metal. Because second portion of the channel region 13b is not substantially depleted during operation, the effective gate length can be set by the overlap of gate layer 22 over first portion of the channel region 13a. Source/drain regions 25a and 25b of the first conductivity type are then formed in semiconductor material 10 overlapping portions of first portion of channel region 13a and second portion of channel region 13b. Source/drain regions 25a and 25b are preferably formed by ion implantation of a suitable N+ dopant.

FIG. 1 illustrates the essential parts of a MESFET device. Of course, those skilled in the art will recognize that there are many ways to fabricate the device shown. For example, another way to form the first portion of channel region 13a is by epitaxial layer growth on substrate 10. In addition, the device of FIG. 1 can be formed to be a HEMT device by replacing first portion of channel region 13a by a multilayer channel region including an N+ GaAs layer, an N− GaAs layer, an N− GaAlAs layer, and an undoped GaAs layer. The formation of a HEMT device, not including second portion of the channel region 13b, is well known by those skilled in the art.

Figure 2:
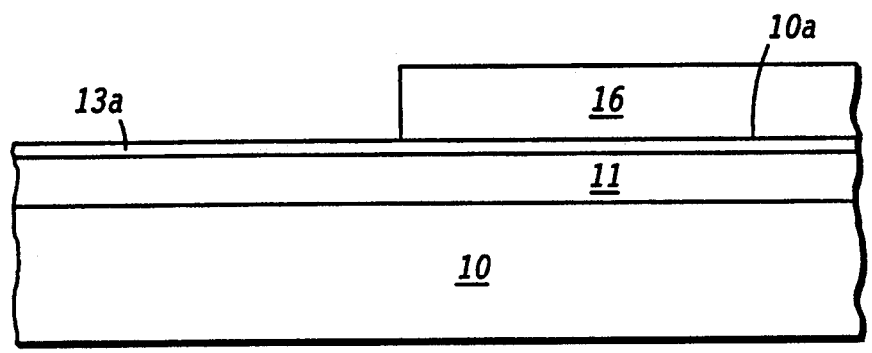
FIG. 2 illustrates an enlarged, cross-sectional view of a second embodiment of the present invention in a beginning stage of fabrication.

FIGS. 2-7 illustrate processing of a second embodiment of a semiconductor MESFET in accordance with the present invention. FIG. 2 illustrates a second embodiment of the present invention in a beginning stage of fabrication. The same numerals used in FIG. 1 will be used to refer to the same or similar regions or layers. First, a doped region 11 is formed by selective ion implantation of suitable dopants of a second conductivity type, P-type in this embodiment, in semiconductor material 10. Then, a first portion of the channel region 13a is formed inside doped region 11 by ion implantation of suitable dopants of the first conductivity type. In a preferred embodiment, silicon is ion implanted at a dose of approximately $1 \times 10^{13}$ atoms/cm$^3$ at an energy of approximately 40 KeV. Other suitable doses and energies may be used. Doped region 11 is used to enhance the characteristics of first portion of the channel region 13a, and is not absolutely necessary to form a working device. Thus, this embodiment, as well as the other embodiments described herein, can be formed with or without doped region 11.

After first portion of the channel region 13a is formed, a dielectric layer 16 is formed over first top surface 10a of semiconductor material 10 and subsequently patterned to be disposed on a portion of first top surface 10a. Dielectric layer 16 is preferably comprised of dielectric layers such as silicon dioxide, silicon nitride, silicon oxynitride, or a combination thereof. In a preferred embodiment, dielectric layer 16 is comprised of silicon nitride. The thickness of dielectric layer 16 is preferably approximately 0.2 to 0.3 microns.

Figure 3:
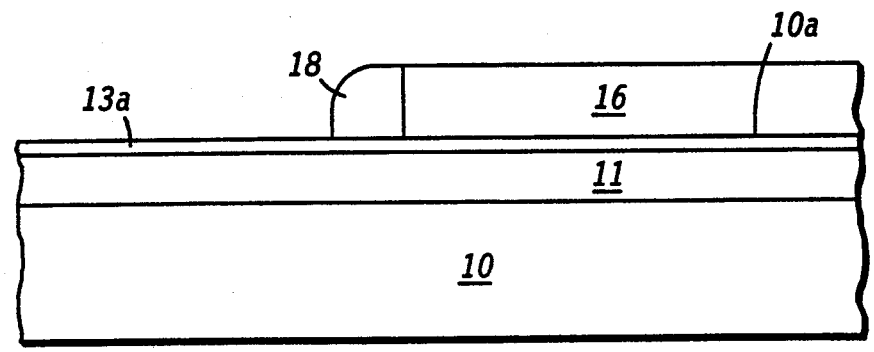
FIG. 3 illustrates an enlarged, cross-sectional view of the second embodiment of the present invention in a further stage of fabrication.

FIG. 3 illustrates the structure of FIG. 2 further along in processing. A conformal layer is formed over first top surface 10a of substrate 10 and over dielectric layer 16 and subsequently etched to form a spacer 18. The formation of spacers by using an anisotropic etch is well known in the art. The conformal layer or spacer 18 may be comprised of a metal layer, a dielectric layer such as silicon dioxide, silicon nitride, silicon oxynitride, or a combination thereof. In a preferred embodiment, the conformal layer or spacer 18 is comprised of a refractory metal.

FIG. 4 illustrates the structure of FIG. 3 further along in processing. An etch is performed to remove a portion of doped region 11 and first portion of the channel region 13a in a region adjacent spacer 18 to form a second top surface 10b in semiconductor material 10. Afterwards, the width and the thickness of spacer 18 is reduced by using an isotropic etch. Preferably, approximately 200 Angstroms are removed from spacer 18.

FIG. 5 illustrates the structure of FIG. 4 further along in processing. Selective ion implantation, similar to the ion implantation used to form first portion of channel region 13a, is performed to form a second portion of the channel region 13b. Spacer 18 and dielectric layer 16 prevent the penetration of dopants thereunder so that second portion of the channel region 13b is formed in semiconductor material 10 extending away from spacer 18. Dielectric layer 16 is spaced a predetermined distance away from second portion of the channel region 13b determined by the width of spacer 18. Suitable dopants of the first conductivity type are used to form region 13b. First and second portions of the channel region 13a and 13b together form a continuous region. The gate length of the MESFET in this embodiment is established by spacer 18, because as explained earlier, second portion of the channel region 13b is fabricated so that it is not substantially depleted during operation. As can also be seen, a method of fabricating a MESFET with a self-aligned gate has been provided.

FIG. 6 illustrates a structure as shown in FIG. 5 further along in processing. A layer preferably comprised of a refractory metal is formed on the surface of the structure shown in FIG. 6. The layer is then patterned to form a gate layer 22 which extends over a portion of dielectric layer 16 and over a portion of the second portion of the channel region 13b. If spacer 18 is comprised of a dielectric layer, then it is removed prior to the formation of gate layer 22. However, if spacer 18 is comprised of a refractory metal layer, then it may remain as shown.

Figure 7:
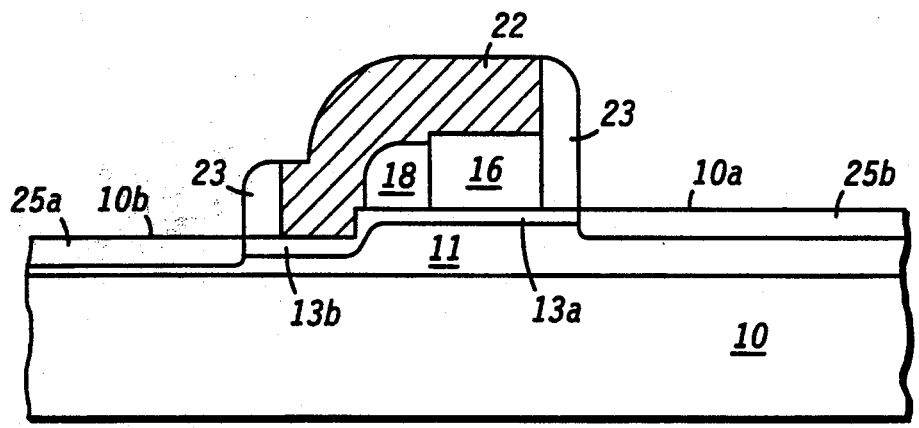
FIG. 7 illustrates an enlarged, cross-sectional view of the second embodiment of the present invention in a further stage of fabrication.

FIG. 7 illustrates a structure as shown in FIG. 6 further along in processing. The portion of dielectric layer 16 where gate layer 22 is not formed thereover is removed using standard etch processes. Subsequently, a conformal layer is formed and etched to form spacers 23 adjacent to gate layer 22 and dielectric layer 16. A source/drain region 25a is then formed in second surface 10b of semiconductor material 10 and a source/drain region 25b is formed in first surface 10a of semiconductor material 10 by ion implantation of suitable dopants of the first conductivity type, in this embodiment, N+ type dopants. Conventional processing is utilized to finish the MESFET, which is not shown here, because it is well known in the art.

Figure 8:
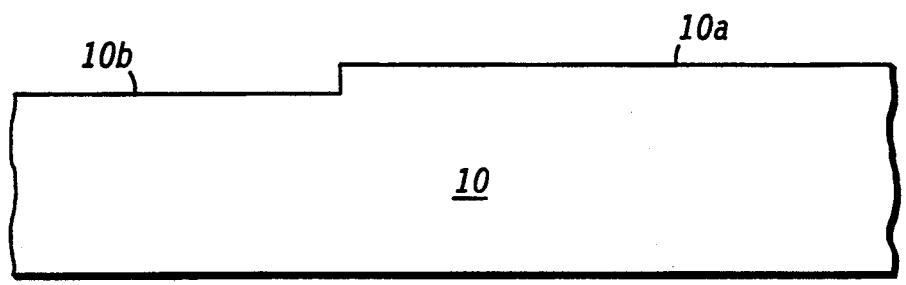
FIG. 8 illustrates an enlarged, cross-sectional view of a third embodiment of the present invention in a beginning stage of fabrication.

FIGS. 8-13 illustrate the processing of a third embodiment of a semiconductor MESFET in accordance with the present invention. The same numerals used in FIGS. 2-7 will be used to refer to the same or similar regions or layers. Where the same or similar regions or layers are formed, the processing thereof is essentially the same as that discussed with reference to FIGS. 2-7, and therefore their formation will not be further elaborated on. FIG. 8 illustrates a third embodiment of the present invention in a beginning stage of fabrication. In this embodiment a portion of semiconductor material 10 is etched first to form a second top surface 10b. This is accomplished by standard processing well known in the art.

Figure 9:
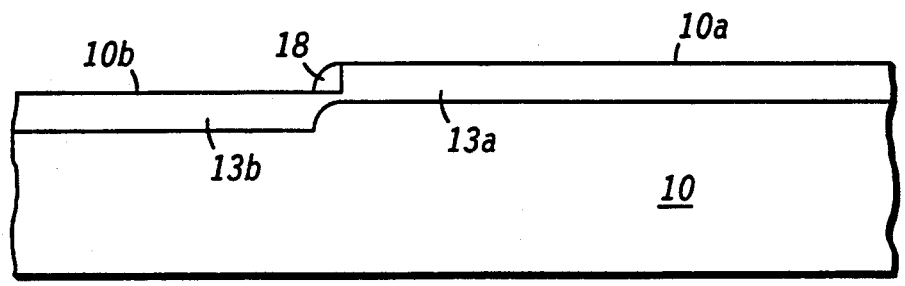
FIG. 9 illustrates an enlarged, cross-sectional view of the third embodiment of the present invention in a further stage of fabrication.

FIG. 9 illustrates the structure of FIG. 8 further along in processing. A spacer 18 is formed on second top surface 10b adjacent to first top surface 10a. Subsequently, a channel region having first and second portions 13a and 13b is formed by ion implantation in semiconductor material 10 extending from first and second top surfaces 10a and 10b, respectively, into semiconductor material 10.

FIG. 10 illustrates the structure of FIG. 9 further along in processing. Spacer 18 is reduced in thickness and width. Doped region 11 is then formed in semiconductor material 10 extending down into semiconductor material 10 further than first and second portions of the channel region 13a and 13b.

FIG. 11 illustrates the structure of FIG. 10 further along in processing. A gate layer 22 is formed and patterned to extend over a portion of first top surface 10a and over a portion of second top surface 10b.

FIG. 12 illustrates the structure of FIG. 11 further along in processing. Spacers 23 are formed adjacent to gate layer 22.

FIG. 13 illustrates the structure of FIG. 12 further along in processing. Source/drain regions 25a and 25b are formed in semiconductor material 10. Conventional processing is used to finish the MESFET.

FIGS. 14–19 illustrate the processing of a fourth embodiment of a semiconductor MESFET in accordance with the present invention. The same numerals will be used to refer to the same or regions or layers as that shown in FIGS. 2–13. FIG. 14 illustrates a fourth embodiment of the present invention in a beginning stage of fabrication. In this embodiment, a dielectric layer 16 is formed on a portion of first top surface 10a as in FIG. 2. Next, a spacer 18 is formed on surface 10a adjacent to dielectric layer 16. Then, a channel region having first and second portions 13a and 13b is formed. Thereafter, doped region 11 is formed. The sequence of forming regions 13a and 13b and 11 may be interchanged.

FIG. 15 illustrates the structure of FIG. 14 further along in processing. A gate layer 22 is formed, and spacers 23 are then formed adjacent to gate layer 22 as described with reference to the second embodiment. Dielectric layer 16 not protected by gate layer 22 or spacer 23 is then removed.

Figure 16:
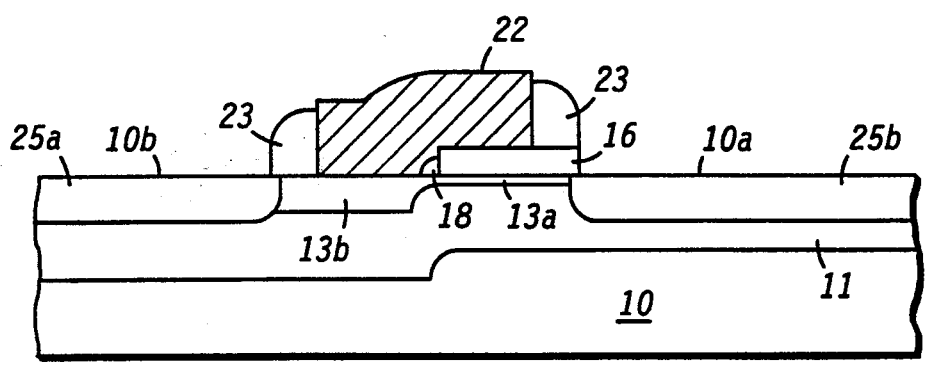
FIG. 16 illustrates an enlarged, cross-sectional view of the fourth embodiment of the present invention in a further stage of fabrication.

FIG. 16 illustrates the structure of FIG. 15 further along in processing. Source/drain regions 25a and 25b are formed in semiconductor material 10. The MESFET is then completed using standard processes well known in the art.

As can be readily seen, there has been provided several methods of fabricating a self-aligned MESFET. The gate length of the MESFET is established by spacer 18 in the second, third, and fourth embodiments. A MESFET having an effective gate length of approximately 0.1 to 0.2 microns can be manufactured by the present invention. This gate length is shorter than that which can be achieved by standard photolithographic means, thus a higher frequency response device is fabricated using the present invention.

We claim:

1. A semiconductor device, comprising:
   a semiconductor material, having a top surface and a bottom surface;
   a first portion of a channel region of a first conductivity type formed in the semiconductor material extending from the top surface into the semiconductor material;
   a second portion of the channel region of the first conductivity type formed in the semiconductor material extending from the top surface into the semiconductor material, wherein the second portion of the channel region is continuous with the first portion of the channel region and extends further into the semiconductor material from a portion of the top surface than the first portion of the channel region;
   a dielectric layer disposed on a first portion of the top surface over a portion of the first portion of the channel region and disposed a predetermined distance away from the second portion of the channel region;
   a gate layer disposed on the top surface of the semiconductor material over a portion of the first and the second portions of the channel region and disposed on a portion of the dielectric layer; and
   a spacer disposed adjacent the gate layer on a portion of the semiconductor material and on a portion of the dielectric layer.

2. The semiconductor device of claim 1 further comprising a first source/drain region of the first conductivity type formed in the semiconductor material extending from the top surface into the semiconductor material and overlapping a portion of the first portion of the channel region and a second source/drain region formed in the semiconductor material extending from the top surface into the semiconductor material and overlapping a portion of the second portion of the channel region.

3. The semiconductor device of claim 1 further comprising a region of a second conductivity type formed in the semiconductor material extending from the top surface into the semiconductor material further than the second portion of the channel region.

4. The semiconductor device of claim 1 wherein the semiconductor material is comprised of a semi-insulating gallium arsenide substrate.

5. The semiconductor device of claim 1 wherein the top surface of the semiconductor material has a first portion and a second portion and wherein the second portion of the top surface is at a lower level than the first portion of the top surface and further wherein the first portion of the channel region is formed in the semiconductor material in the first portion of the top surface and wherein the second portion of the channel region extends into the semiconductor material closer to the bottom surface than the first portion of the channel region.

6. A semiconductor device, comprising:
   a semiconductor material, having a top surface;
   a first portion of a channel region of a first conductivity type formed in the semiconductor material extending from the top surface into the semiconductor material;
   a second portion of the channel region of the first conductivity type formed in the semiconductor material extending from the top surface into the semiconductor material, wherein the second portion of the channel region is continuous with the first portion of the channel region and which is not substantially depleted during operation of the semiconductor device;
   a dielectric layer disposed on a first portion of the top surface over a portion of the first portion of the channel region and disposed a predetermined distance away from the second portion of the channel region;
   a first spacer disposed on the first portion of the top surface adjacent the dielectric layer;
   a gate layer disposed on a portion of the dielectric layer and disposed on a second portion of the top surface over a portion of the first and the second portions of the channel region and disposed on the first spacer; and a second spacer disposed adjacent the gate layer on a portion of the semiconductor material and on a portion of the dielectric layer.

7. The semiconductor device of claim 6 further comprising a first source/drain region of the first conductivity type formed in the semiconductor material extending from the top surface into the semiconductor material and overlapping a portion of the first portion of the channel region and a second source/drain region formed in the semiconductor material extending from the top surface into the semiconductor material and overlapping a portion of the second portion of the channel region.

8. The semiconductor device of claim 6 wherein the dielectric layer is comprised of a silicon nitride layer.

9. The semiconductor device of claim 6 further comprising a region of a second conductivity type formed in the semiconductor material extending from the top surface into the semiconductor material further than the second portion of the channel region.

10. The semiconductor device of claim 6 wherein the semiconductor material is comprised of a semi-insulating gallium arsenide substrate.

11. The semiconductor device of claim 6 wherein the top surface of the semiconductor material has a first portion and a second portion and wherein the second portion of the top surface is at a lower level than the first portion of the top surface and further wherein the first portion of the channel region is formed in the semiconductor material in the first portion of the top surface and wherein the second portion of the channel region extends further into the semiconductor material than the first portion of the channel region from the first portion of the top surface.

12. A semiconductor device, comprising:
a semiconductor material, having a bottom surface, a first top surface and a second top surface, wherein the second top surface is at a lower level than the first top surface;
a first portion of a channel region of a first conductivity type formed in the semiconductor material extending from the first top surface into the semiconductor material;
a second portion of the channel region of the first conductivity type formed in the semiconductor material extending from the second top surface into the semiconductor material and extending from a portion of the first top surface into the semiconductor material, wherein the second portion of the channel region is continuous with the first portion of the channel region and which is not substantially depleted during operation of the semiconductor device, and wherein the second portion of the channel region extends into the semiconductor material closer to the bottom surface than the first portion of the channel region;
a dielectric layer disposed on a first portion of the first top surface over a portion of the first portion of the channel region and disposed a predetermined distance away from the second portion of the channel region;
a gate layer disposed on a portion of the dielectric layer and disposed on a second portion of the first top surface over a portion of the first and the second portions of the channel region and disposed on a first portion of the second top surface over a portion of the second portion of the channel region; and
a spacer disposed adjacent the gate layer on a portion of the semiconductor material and on a portion of the dielectric layer.

13. The semiconductor device of claim 12 further comprising a first source/drain region of the first conductivity type formed in the semiconductor material extending from the top surface into the semiconductor material and overlapping a portion of the first portion of the channel region and a second source/drain region formed in the semiconductor material extending from the top surface into the semiconductor material and overlapping a portion of the second portion of the channel region.

14. The semiconductor device of claim 12 wherein the first dielectric layer is comprised of a silicon nitride layer.

15. The semiconductor device of claim 12 further comprising a region of a second conductivity type formed in the semiconductor material extending from the first and the second top surface into the semiconductor material further than the second portion of the channel region.

16. The semiconductor device of claim 12 wherein the semiconductor material is comprised of a semi-insulating gallium arsenide substrate.

* * * * *